United States Patent
Hansen et al.

(10) Patent No.: US 8,659,206 B2
(45) Date of Patent: Feb. 25, 2014

(54) METHOD FOR PRODUCING A DIELECTRIC LAYER IN AN ELECTROACOUSTIC COMPONENT, AND ELECTROACOUSTIC COMPONENT

(75) Inventors: Ulli Hansen, Berlin (DE); Jürgen Leib, Neunkirchen am Brand (DE); Simon Maus, Berlin (DE)

(73) Assignee: MSG Lithoglas AG, Berlin (DE)

( * ) Notice: Subject to any disclaimer, the term of this patent is extended or adjusted under 35 U.S.C. 154(b) by 344 days.

(21) Appl. No.: 13/055,616

(22) PCT Filed: Jul. 23, 2009

(86) PCT No.: PCT/DE2009/001033
§ 371 (c)(1),
(2), (4) Date: Apr. 8, 2011

(87) PCT Pub. No.: WO2010/009719
PCT Pub. Date: Jan. 28, 2010

(65) Prior Publication Data
US 2011/0175487 A1 Jul. 21, 2011

(30) Foreign Application Priority Data
Jul. 23, 2008 (DE) .......................... 10 2008 034 372

(51) Int. Cl.
*H03H 9/05* (2006.01)
(52) U.S. Cl.
CPC .................................. *H03G 9/059* (2013.01)
USPC ..................................................... 310/313 R
(58) Field of Classification Search
CPC ...................................................... H03H 9/059
USPC ........ 310/313 R, 313 A, 313 B, 313 C, 313 D
See application file for complete search history.

(56) References Cited

U.S. PATENT DOCUMENTS

| 4,506,435 A | 3/1985 | Pliskin et al. |
| 7,589,453 B2 | 9/2009 | Meister et al. |
| 7,851,977 B2 | 12/2010 | Ruile et al. |
| 2002/0047501 A1* | 4/2002 | Tsuda et al. .................. 310/348 |

(Continued)

FOREIGN PATENT DOCUMENTS

| JP | H09-46156 A1 | 2/1997 |
| JP | H10-56350 A1 | 2/1998 |

(Continued)

OTHER PUBLICATIONS

International Search Report for PCT/DE2009/001033, Nov. 23, 2009.

(Continued)

*Primary Examiner* — Derek Rosenau
(74) *Attorney, Agent, or Firm* — Smith Patent Office (57) ABSTRACT

The invention relates to a method for producing a dielectric layer (3) in an electroacoustic component (1), in particular a component operating with acoustic surface waves or bulk acoustic waves, comprising a substrate and an associated electrode structure, in which the dielectric layer (3) is formed at least in part by depositing by a thermal vapor deposition process at least one evaporation material selected from the following group of layer vaporising materials: vapor deposition glass material such as borosilicate glass, silicon nitride and aluminum oxide. The invention further relates to an electroacoustic component.

9 Claims, 6 Drawing Sheets

(56) References Cited

U.S. PATENT DOCUMENTS

| | | |
|---|---|---|
| 2003/0122453 A1 | 7/2003 | Yamada et al. |
| 2007/0001549 A1 | 1/2007 | Kando |
| 2007/0166520 A1 | 7/2007 | Leib et al. |
| 2008/0067896 A1* | 3/2008 | Inoue et al. ............... 310/335 |
| 2010/0225201 A1 | 9/2010 | Roesler et al. |

FOREIGN PATENT DOCUMENTS

| | | |
|---|---|---|
| JP | 2001-14649 A1 | 1/2001 |
| JP | 2001-271157 A | 10/2001 |
| JP | 2003-347612 A | 12/2005 |
| JP | 2006-279609 A | 10/2006 |
| JP | 2006-338983 A | 12/2006 |
| JP | 2007-335468 A | 12/2007 |
| WO | 02/082645 | 10/2002 |
| WO | 03/100846 A2 | 12/2003 |
| WO | 2005/086345 A1 | 9/2005 |
| WO | 2006/058579 A1 | 6/2006 |
| WO | 2007/059740 A2 | 5/2007 |
| WO | 2007/085237 A1 | 8/2007 |

OTHER PUBLICATIONS

Mund et al., Novel Microstructuring Technology for Glass on Silicon and Glass-Substrates, 54th Electronic Components and Technology Conference, 2004, Proceedings vol. 1, pp. 939-942.

Zoschke et al., Evaluation of Micro structured Glass Layers as Dielectric- and Resistors, 57th Electronic Components and Technology Conference, 2007, Proceedings, pp. 566-573.

Leib et al., New Wafer-Level-Packaging Technology using Silicone-Via-Contacts for Optical and Other Sensor Applications, 54th Electronic Components and Technology Conference, 2004, Proceedings vol. 1, pp. 843-847.

Japanese Office Action for JP Patent Application No. 2011-519038, dated Jun. 25, 2013, 8 pages.

* cited by examiner

METHOD FOR PRODUCING A DIELECTRIC LAYER IN AN ELECTROACOUSTIC COMPONENT, AND ELECTROACOUSTIC COMPONENT

The invention relates to technologies involved in electroacoustic components.

BACKGROUND OF THE INVENTION

Electroacoustic components are known as components that operate, for example, with acoustic surfaces or with bulk acoustic waves. A component that operates with acoustic surface waves is described for example in the document WO 2006/058579. Document WO 2007/059740 discloses a component operating with bulk acoustic waves. A further electroacoustic component is disclosed in the document WO 2007/085237. Common to the electroacoustic components is the fact that electrode structures, which are connected to contacts that lead out of the device, are usually formed in a metallic layer on a substrate consisting of a piezoelectric material. The electrode structure is covered with a layer consisting of a dielectric material, for example silicon dioxide.

DESCRIPTION OF THE INVENTION

It is the object of the invention to provide enhanced technologies for electroacoustic components, which allow the production of the components to be optimised. A further object is to simplify the individual configurability of the component during the production process.

This problem is solved according to the invention by means of an electroacoustic component and a method for producing a dielectric layer in an electroacoustic component as described herein. Advantageous configurations of the invention are the subject matter of dependent secondary claims.

The invention comprises the concept of a method for producing a dielectric layer in an electroacoustic component, in particular a component operating with acoustic surface waves or bulk acoustic waves, comprising a substrate with an associated electrode structure, in which the dielectric layer is formed at least in part by depositing by thermal vapour deposition at least one evaporation material selected from the following group of evaporation materials: vapour deposition glass material, silicon dioxide, silicon nitride and aluminium oxide.

According to a further aspect of the invention, an electroacoustic component, in particular a component operating with acoustic surface or bulk acoustic waves, created with a substrate and an associated electrode structure and a thermally vapour deposited, dielectric layer, which is selected at least in part from at least one evaporation material from the following group of evaporation materials: vapour deposition glass material, silicon dioxide, silicon nitride and aluminium oxide.

An advantage which is obtained with the invention in comparison to the prior art, consists in the fact that the use of the thermal vapour deposition of the layer material for the dielectric layer facilitates an optimised layer deposition. Furthermore, the thermal vapour deposition can be varied on an individual basis depending on the desired type of application, in order to furnish the dielectric layer, and therefore the electroacoustic component, with the desired component properties during production. In addition, during the deposition of the dielectric layer, the thermal vapour deposition process layer facilitates a rapid production of this layer, which means that the processing times in production can be optimised overall.

The at least one evaporation material can be a single component system such as silicon dioxide or a multi-component system, for example borosilicate glass, which is a vapour deposition glass material. Vapour deposition glass material is understood here to include glass-like vapour deposition materials. Evaporation materials as such are described for example in the document U.S. Pat. No. 4,506,435 A1. In addition, for example, the following products can be used: Schott 8329, Corning 7740(Pyrex), Corning 7070 and Fused Silica.

In different configurations of the invention, the dielectric layer can be implemented in either single-layered or multi-layered form. In a multi-layered construction it can be provided such that at least one partial layer of a vapour deposition glass material and at least one additional partial layer of a silicon oxide is deposited. The dielectric layer can be applied directly on to the substrate or onto one or more already present base layers on the substrate, which comprise for example one or more dielectric layers, or consist thereof.

The dielectric layer can be produced either completely or only partially by means of thermal vapour deposition, in particular plasma-assisted thermal vapour deposition. In one configuration, in addition to one or more partial layers of the dielectric layer, which are deposited by means of thermal vapour deposition, one or more additional partial layers can be formed, using other production methods, for example by means of sputtering or the CVD-process ("Chemical Vapour Deposition", or Chemical Gas-phase deposition). These production methods can also be used for example in the deposition of silicon nitride. The one or the additional partial layers of the dielectric layer can be processed before and/or after the deposition of the one or more partial layers.

The dielectric layer as a whole or in its partial layers can be produced with a homogeneous layer constructed, so that physical and/or chemical properties, for example the propagation properties for acoustic waves, are substantially identical over the respective layer region. Alternatively it can be provided that, for the dielectric layer in its entirety or partial layer regions thereof, a non-homogeneous layer construction is produced, which leads to regions that differ with respect to the chemical and/or physical properties within the non-homogeneous layer or the non-homogeneous partial layer, for example to non-uniform propagation properties for acoustic waves or to passivating (Moisture-Sensitivity-Level-1 according to JEDEC-STD-020C) and hermetic (He-leakage rate according to MIL-STD-833F) properties of the above layer region. A combination of at least one homogeneous partial layer with at least one non-homogeneous partial layer can also be produced for the dielectric layer.

The invention can be applied both in components operating with acoustic surface waves as well as in those operating with bulk acoustic waves. In both cases it can be provided that the dielectric layer is produced in such a way that it either wholly or partially encloses an electrode structure formed on a piezoelectric substrate.

The production of the dielectric layer in the electroacoustic component preferably takes place in the so-called wafer compound.

After the formation of the dielectric layer with sufficient passivating properties of an upper layer region, the component thus produced is pre-packaged and ready to be directly further processed. The pre-packaging procedure is referred to as "pre-packaging". An otherwise common type of post-processing, by means of the so-called "cavity-package", can thus be dispensed with The protective properties provided in the Pre-Packaging process are additionally advantageous for the detachment and removal of the component from the wafer compound, which is performed for example by means of separation by sawing. The contacting of the component can be carried out by means of wire-bonding or a Flip-Chip assembly and then immediately encapsulating it with a plastic material ("moulding"). Due to the pre-packaging, the possibility also exists of mounting the electroacoustic component in more complex modules and moulding them with plastic in a single step.

In one embodiment of the invention the thermal deposition is carried out in the form of a plasma-assisted thermal vapour deposition. By means of the plasma-based method, the advantages of the use of thermal vapour deposition described above can be applied to the deposition of the layer in an optimised manner. In the plasma-assisted method of thermal vapour deposition of a layer vaporising material the material to be deposited is thermally evaporated and then condensed in the region of the dielectric layer to be produced, wherein this process is assisted by means of a plasma application, which results in energy being transferred by ionised plasma components to the thermally evaporated particles of the evaporation material by means of shock-impulse transmission. A directed adjustment of the parameters for the plasma facilitates an individual formation of the dielectric layer for the electroacoustic component, in particular with regard to its acoustic and passivating parameters.

A preferred embodiment of the invention provides that the thermal evaporation is carried out by electron beam evaporation. Using an electron beam the evaporation material, which is made available in a source, is evaporated, in order to subsequently deposit it in the region of the dielectric layer to be produced. The vapour deposition energy is transmitted to the evaporation material by means of an electron beam ("e-beam"), in the source which is normally constructed in the form of a crucible. Using the electron beam evaporation technique, high energy densities and temperatures can be achieved.

In an advantageous embodiment of the invention the dielectric layer can be structured by means of at least one structuring method selected from the following group of von structuring methods: lift-off process, reactive plasma etching and wet-chemical etching. In a lift-off process, a negative image of the desired structuring is first produced on the substrate on which the evaporation material is to be deposited in a structured form, by means of a photoresist. After this, the plasma-assisted thermal evaporation of the evaporation material, i.e. vapour deposition glass material and/or silicon dioxide, takes place in the wafer compound. Finally the so-called lift-off step takes place, in which the photoresist that was deposited before the thermal evaporation is removed. The structuring of the applied photoresist before the plasma-assisted thermal evaporation is usually carried out by irradiation with UV light. Alternatively or in addition to the Lift-off process, the known methods of wet etching or dry etching can be applied for structuring the dielectric layer. Although the component is subject to chemical and mechanical stresses with these methods, in certain applications these can nevertheless be tolerated.

An advantageous embodiment of the invention provides that the dielectric layer is formed with a non-uniform degree of material compaction within the dielectric layer. The non-uniform degree of material compaction is set during the plasma-assisted thermal evaporation by the structure of the plasma in the deposition process being varied, so that at different times during the deposition process different degrees of material compaction are produced in the dielectric layer. A relative change in the degree of material compaction is possible by allowing a flow of plasma gas and the high-frequency power in the plasma to be varied. For example, in a plasma initially formed only using oxygen, the flow rate of other process gases such as argon, krypton, xenon or neon, and the high-frequency power of the plasma, are varied either gradually or abruptly to cause the degree of material compaction to increase. On the other hand, a relative reduction in the degree of material compaction over the dielectric layer or partial layers thereof is also possible. Non-uniform degrees of material compaction can alternatively or additionally also be produced by having the dielectric layer be produced using different evaporation materials. The use of adjustments to the degree of material compaction allows the acoustic impedance of the dielectric layer in the different layer regions to be controlled. A high propagation velocity for acoustic waves can thus be obtained by means of a low level of material compaction. Conversely, a high degree of material compaction leads to a slow propagation velocity for acoustic waves. The transitions between regions with different degrees of material compaction can be designed to be continuous, that is, in the sense of a gradient, or non-continuous. So, for example, a vertical propagation velocity gradient is particularly important for the functioning of components with guided bulk waves.

A preferred embodiment of the invention provides that, on a side of the dielectric layer that is proximate to an electrode structure, a proximal degree of material compaction is formed, which is higher than a distal degree of material compaction on a side of the dielectric layer that is distant from the electrode structure. The transition between the proximal degree of material compaction and the distal degree of material compaction can be a continuous transition within the dielectric layer. In this manner a gradient is formed in the degree of material compaction. The construction with proximal and distal degrees of material compaction can also be provided for a partial layer of the dielectric layer, whereas other sub-regions of the dielectric layer have a substantially uniform degree of material compaction.

A preferred embodiment of the invention provides that, when forming the dielectric layer, silicon dioxide is deposited on the side close to the electrode structure in a substantially stoichiometric manner. A stoichiometric deposition means that the chemical constituents of silicon dioxide, namely silicon and oxygen, are deposited substantially in accordance with their stoichiometric ratio in this chemical compound. In one configuration this can be followed by a partial layer of a vapour deposition glass material, aluminium oxide or silicon nitride, on to a region of the stoichiometric deposit of silicon dioxide. The stoichiometric deposit of silicon dioxide has a favourable effect on the temperature gradient of the component, which is of particular importance for electroacoustic components.

A preferred embodiment of the invention provides that on the side closer to the electrode structure the dielectric layer is formed with a base layer, and on the side further from the electrode structure with a passivating covering layer. The base layer and the passivating covering layer can be formed in accordance with the previously described proximal and distal material properties. In one embodiment it can be provided that, in order to construct the base layer, a plasma with a high oxygen content or even a pure oxygen plasma is used, whereas in the construction of the covering layer a lower oxygen content or even an oxygen-free plasma is used, by having the plasma now only contain one or more other gases such as argon, krypton, xenon or neon. In this manner the covering layer is produced with an increased degree of material compaction in comparison to the base layer. It is thus possible in a preferred extension of the invention to construct the covering layer as a passivating layer, which in particular provides protection for the component against environmental effects. The higher degree of material compaction has the particular consequence that the penetration of moisture into the layer is minimised or even completely prevented. The use of a vapour deposition glass material for the construction of the covering layer is particularly preferred, since this means that better hermetic properties of the covering layer are obtained. The different properties of the materials of the vapour deposition glass material, silicon dioxide, aluminium oxide and silicon nitride enable the desired layer properties to be formed in the production, depending on the type of application.

In one advantageous embodiment of the invention it can be provided that the dielectric layer is formed with a layer thickness between approximately 0.5 μm and approximately 50 μm, preferably with a layer thickness between approximately 3 μm and approximately 10 μm. The latter is preferred in particular in connection with layers that do not have uniform layer properties. A minimum layer thickness is required in order to allow the acoustic waves in the upper part of the layer to completely dissipate. In any case, the structure of a gradient layer requires the layer to have a minimum height. The prepackaging process in particular requires a specific layer thickness, in order to optimally protect the component in the further processing stages. Higher layer thicknesses would not be economically viable. In addition, considerable residual voltages can occur in the layer.

One advantageous embodiment of the invention provides that the dielectric layer is deposited at a layer deposition rate between approximately 30 nm/min and approximately 1000 nm/min, preferably at a layer deposition rate between approximately 50 nm/min and approximately 300 nm/min. In this rate range the residual stress of the dielectric layer with regard to mechanical rigidity and least possible influence on electronic filter properties lies in a range that is advantageous for the component. One preferred embodiment of the invention provides that the at least one evaporation material is deposited on a substrate for which a substrate temperature of less than approximately 120° C., and preferably less than approximately 100° C., is set. In the lower limiting range the substrate temperature is preferably approximately room temperature or somewhat higher.

In one advantageous embodiment of the invention the dielectric layer can be deposited with layer regions that differ from one another with respect to their physical and/or chemical properties, by varying the composition of a plasma used in the deposition of the evaporation material. As the source for the plasma a high-frequency excited, magnetic field-assisted plasma beam source can be used, in order to extract a quasi-neutral plasma beam. The variation of the plasma during the deposition of the evaporation material are preferably affected by the process gas composition of the plasma that is used and the values of the settings for the gas flow rate and the high-frequency power. For example, a pure oxygen flow can be provided, advantageously with a flow rate of approximately 10 sccm to approximately 200 sccm, preferably between approximately 20 sccm and approximately 50 sccm. In this range of oxygen flow rate the stoichiometry of an $SiO_2$-layer can be advantageously controlled. Also, in a process gas flow for a process gas which contains at least one other gas, such as neon, krypton, xenon or argon as well as oxygen, or is even oxygen-free, a gas flow rate of approximately 10 sccm to approximately 200 sccm, preferably between approximately 20 sccm and approximately 50 sccm can be used to advantage. It is in these ranges in particular that dielectric layers with reduced residual stress can be realised.

For the different compositions of the process gas flow, high-frequency powers from approximately 100 W to approximately 1000 W are preferably used, preferably from approximately 250 W to approximately 600 W. The high-frequency power controls the ion beam density. The range of the high-frequency power in combination with the indicated gas flow rates is a technically preferred range, since a favourable ratio of the kinetic energy of the plasma components to the ion beam density is produced.

In the deposition chamber used for depositing the evaporation material, chamber pressures of $10^{-3}$ mbar to $10^{-5}$ mbar are used. The applied power to the evaporation material, which varies according to the vapour pressure of the components of the evaporation material involved and the desired layer deposition rate, has a value of preferably approximately 150 W to approximately 1500 W, more preferably of approximately 300 W to approximately 1000 W. This is a power range in which the substrate temperature does not become too high. Temperatures that are too high would damage the polymer on the substrate and therefore impede the lift-off process or even render it impossible. Substrates that are not coated with polymers can however also be vapour deposited with higher power levels and therefore at higher temperatures.

In one advantageous embodiment of the invention the dielectric layer can be formed by means of a co-evaporation of the at least one vapour deposition glass material and the silicon dioxide. In this manner the advantageous properties provided by each of the different materials can be combined with one another.

In connection with the proposed embodiment of the electroacoustic component, the considerations given in connection with relevant embodiments of the production method apply accordingly.

DESCRIPTION OF PREFERRED EMBODIMENTS OF THE INVENTION

In the following the invention will be described in detail with the aid of exemplary embodiments and by reference to Figures. The figures show.

Figure 1:
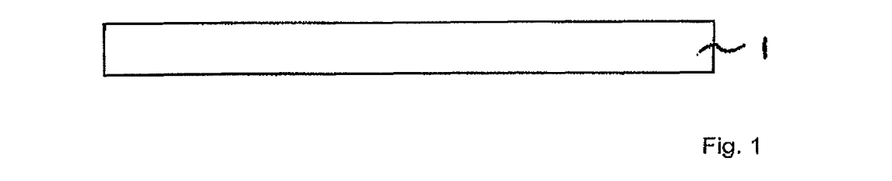
FIG. 1 is a schematic view of a substrate, on which a structured dielectric layer is to be deposited by means of thermal vapour deposition.

FIG. 1 shows a schematic view of a substrate 1, on which a dielectric layer consisting of a evaporation material, namely a vapour deposition glass material, silicon dioxide, silicon nitride or aluminium oxide, is to be deposited using thermal evaporation, wherein an electron beam evaporation process can preferably be used. In the case of electroacoustic components constructed in particular in the form of components operating with acoustic surface waves or with bulk acoustic waves, the substrate 1 is normally a substrate made of a piezoelectric material. A metallic layer with an electrode structure (not shown) is formed on this. The electrode structure can also be constructed as a layer system and usually consists of one or more metallic materials. In the subsequent production of the electroacoustic component a dielectric layer is to be deposited on it, which at least partially covers the electrode structure. In the exemplary embodiment described here the dielectric layer is structured using a lift-off process described in more detail below, in order to facilitate the subsequent electrical contacting of the electrode structure via the contact areas thus exposed.

Figure 2:
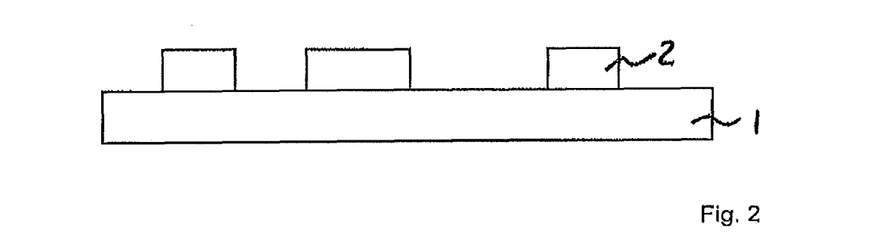
FIG. 2 is a schematic view of the substrate of FIG. 1 with photoresist deposited thereon.

FIG. 2 shows a schematic view of the substrate 1 from FIG. 1, on which a negative image of a desired micro-structuring for the dielectric layer to be deposited is now applied in a photoresist 2 by means of a known lithography technique.

Figure 3:
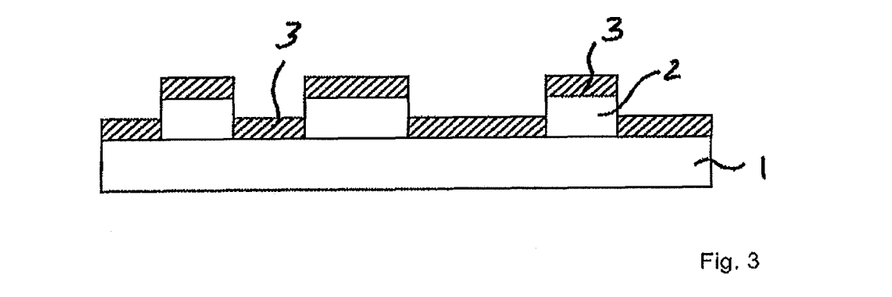
FIG. 3 is a schematic view of the substrate of FIG. 2 with a dielectric layer consisting of a evaporation material now deposited thereon.

Then, a layer of vaporising material is deposited by means of thermal vapour deposition, so that a vapour-deposited layer 3 according to FIG. 3 is produced. In one embodiment a plasma-assisted thermal electron beam evaporation is employed for the deposition of the layer. The vapour-deposited layer 3 is implemented in either single-layered or multi-layer form, wherein at least one vapour deposition glass material, such as borosilicate glass as a multi-component system or a single-component system such as silicon dioxide, aluminium oxide or silicon nitride are deposited. The vapour-deposited layer 3 is formed in one exemplary embodiment with a deposition rate of between approximately 150 nm/min and approximately 300 nm/min.

During the deposition of the dielectric layer the substrate 1 is held at a substrate temperature which is lower than approximately 120° C., preferably lower than approximately 100° C. The deposition of the evaporation material is effected with the assistance of a plasma, for which the process gases oxygen and argon are used. In a preparatory step, a pre-cleaning or conditioning of the surface onto which the evaporation material is to be deposited is carried out, with a plasma formed of argon and oxygen. During the various time intervals of the deposition of the vapour-deposited layer 3 the plasma that is used has different settings, in particular with respect to its gas composition and the plasma power, in order to produce desired layer properties in the vapour-deposited layer.

Figure 4:
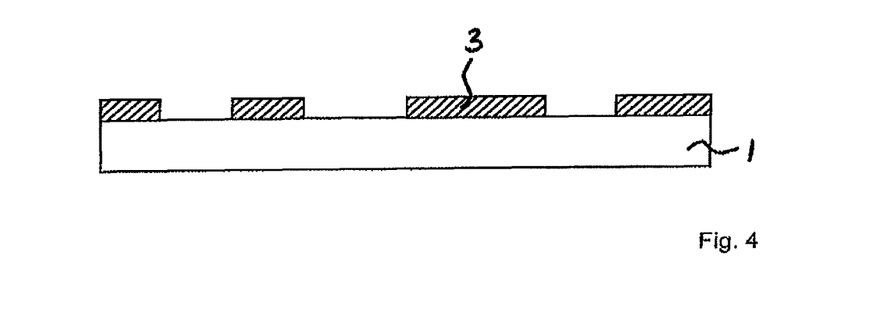
FIG. 4 is a schematic view of the substrate of FIG. 3, wherein the photoresist layer has been removed.

FIG. 4 shows a schematic view of the substrate 1 of FIG. 3, wherein the photoresist layer 2 has been removed.

Further exemplary embodiments are described below, making reference to FIGS. 5 to 12. The same reference labels as in FIGS. 1 to 4 are used for equivalent features.

Figure 5:
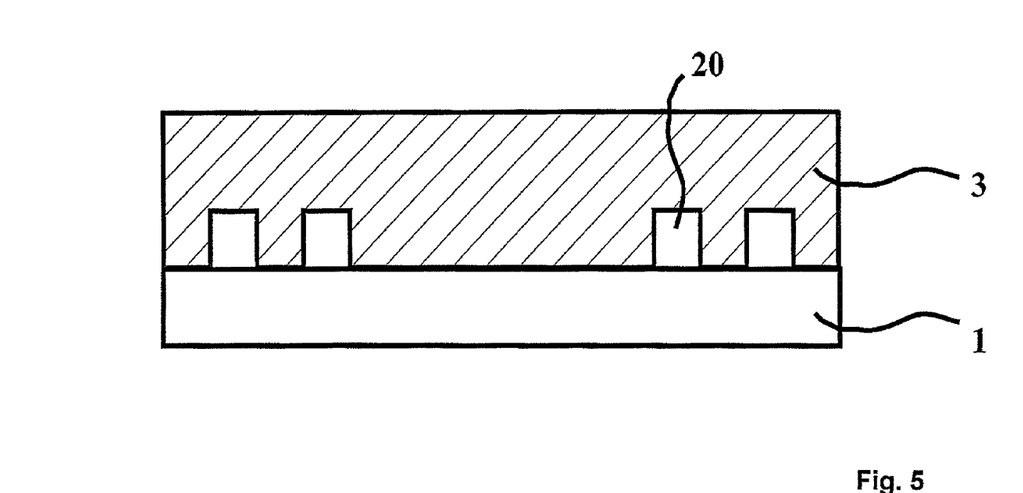
FIG. 5 is a schematic view of an arrangement for an electroacoustic component, in which an electrode structure on a substrate is completely enclosed by a dielectric layer.

FIG. 5 shows a schematic view of an arrangement for an electroacoustic component, in which an electrode structure 20 on a substrate 1 is completely enclosed by a dielectric, vapour deposited layer 3. The substrate 1 is for example made of LiNbO$_3$. On it is formed the electrode structure 20, which is completely enclosed by the vapour-deposited layer 3.

Figure 6:
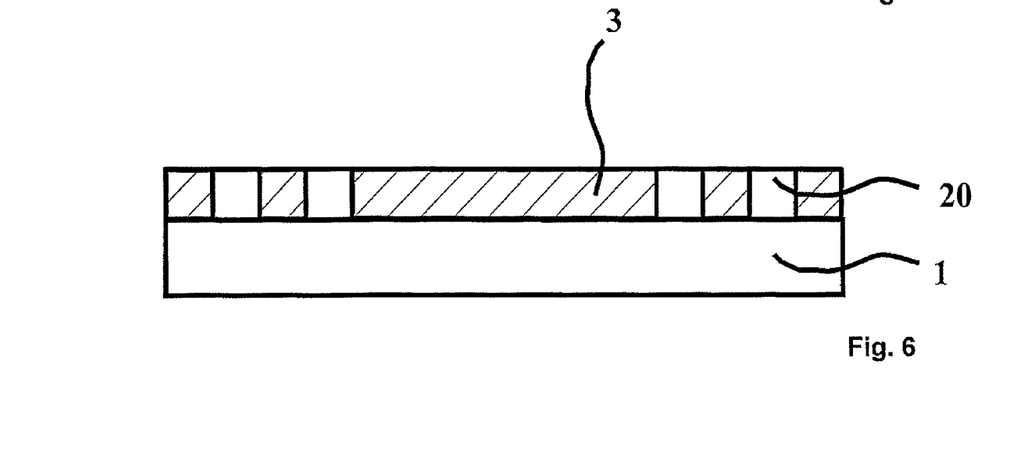
FIG. 6 is a schematic view of an arrangement for an electroacoustic component, in which an electrode structure on a substrate is only partially enclosed by a dielectric layer.

FIG. 6 shows a schematic view of an arrangement for an electroacoustic component, in which an electrode structure 20 on a substrate 1 is partially enclosed by a dielectric, vapour deposited layer 3. In the exemplary embodiment shown the substrate 1 is again made of LiNbO$_3$.

Figure 7:
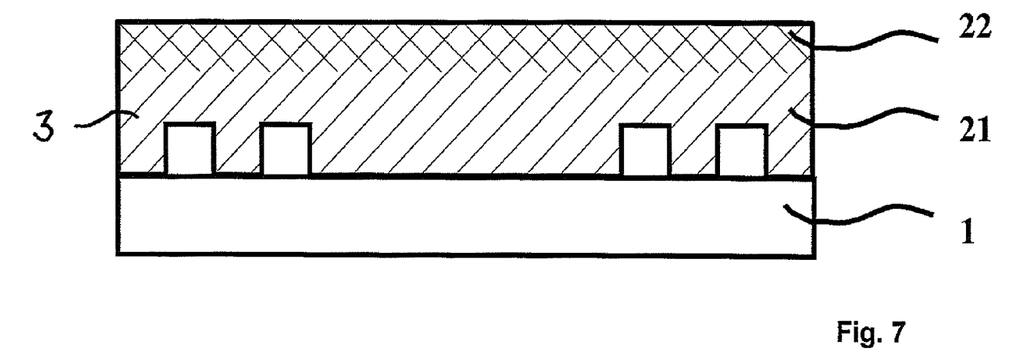
FIG. 7 is a schematic view of an arrangement for an electroacoustic component, in which a gradual transition between layer regions with different properties is formed in a dielectric layer.

FIG. 7 shows a schematic view of an arrangement for an electroacoustic component, in which a gradual transition between layer regions with different properties is formed in a dielectric, vapour deposited layer 3. In the vapour-deposited layer 3, a first and a second layer region 21, 22 are formed, between which a gradual transition takes place.

Figure 8:
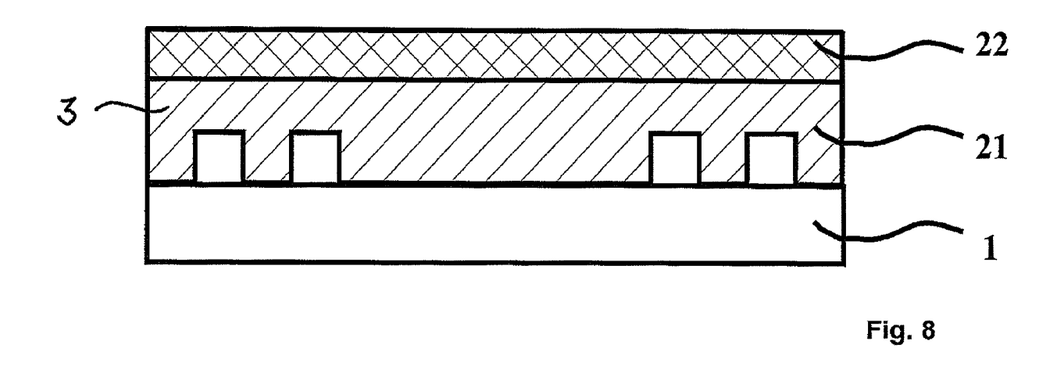
FIG. 8 is a schematic view of an arrangement for an electroacoustic component, in which an abrupt transition between layer regions with different properties is formed in a dielectric layer.

FIG. 8 shows a schematic view of an arrangement for an electroacoustic component, in which a non-gradual transition between layer regions with different properties is formed in a dielectric, vapour deposited layer 3. Between the two layer regions 21, 22 an "abrupt" change in the physical and/or chemical properties takes place.

Figure 9:
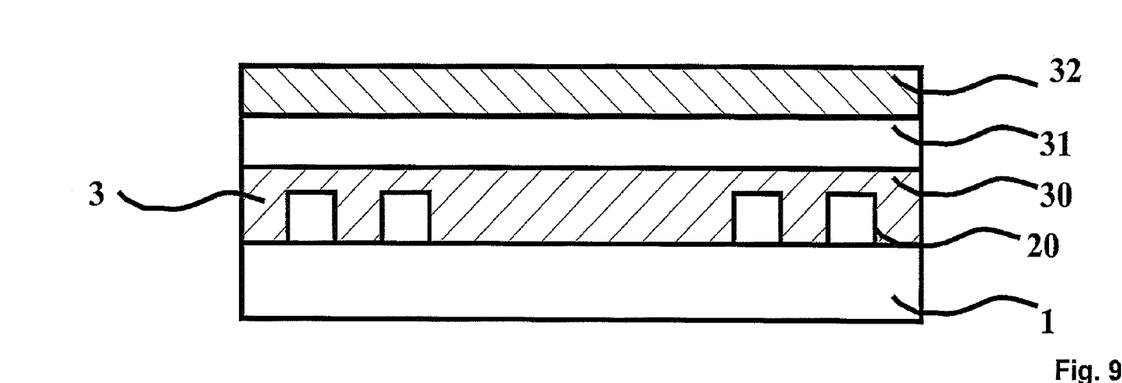
FIG. 9 is a schematic view of a layer arrangement of an electroacoustic component.

FIG. 9 shows a schematic view of a layer arrangement of an electroacoustic component. The arrangement shown is suitable in particular for an electroacoustic component operating with bulk acoustic waves. The vapour-deposited layer 3 comprises three layer regions 30, 31, 32. The lower layer region 30 is a dielectric layer with a good temperature gradient, but with a lower propagation velocity for acoustic waves compared to substrate 1 and the layer region 30 lying above it. The layer region 30 encloses the electrode structure 20 completely, or lies flush with it. The layer region 31 lying above it is also formed as a dielectric layer, but which provides a higher propagation velocity for acoustic waves than the lower layer region 30. The transition between the lower layer region 30 and the layer region 31 above it is characterized by a boundary surface, so that the change in the physical/chemical properties with respect to the propagation velocity for acoustic waves takes place abruptly. The upper layer 32 is a passivating layer. The transition between the upper layer region 32 and the layer region 31 underneath it can be implemented in the form of a gradient or a boundary region.

In the various embodiments a gradual transition between the physical and/or chemical layer properties can be effected by deposition of the vapour deposition material, by gradually varying the plasma parameters used. The rolling or gradual transition can also be implemented however using co-vapour deposition of two vapour deposition materials, in which a second material is slowly brought into play only later in the course of the coating process, and the first material is gradually faded out. The "fading in" of glass, for example, as a second material can be provided, in order to strengthen passivating properties in an upper layer region. The layer region immediately surrounding the electrode structure 20 of the electroacoustic component is preferably produced from pure silicon dioxide, wherein a stoichiometric deposition is provided, which can be obtained by the use of an oxygen plasma. To complete the stack with the layers 30, 31 a layer region having a greater material density is deposited. This facilitates protection of the component against moisture and other environmental influences. The reduced or completely eliminated absorption of moisture reduces residual stresses in these layer regions. The absorption of moisture in sections close to the surface of the dielectric layer can lead to increased compressive stresses.

Figure 10:
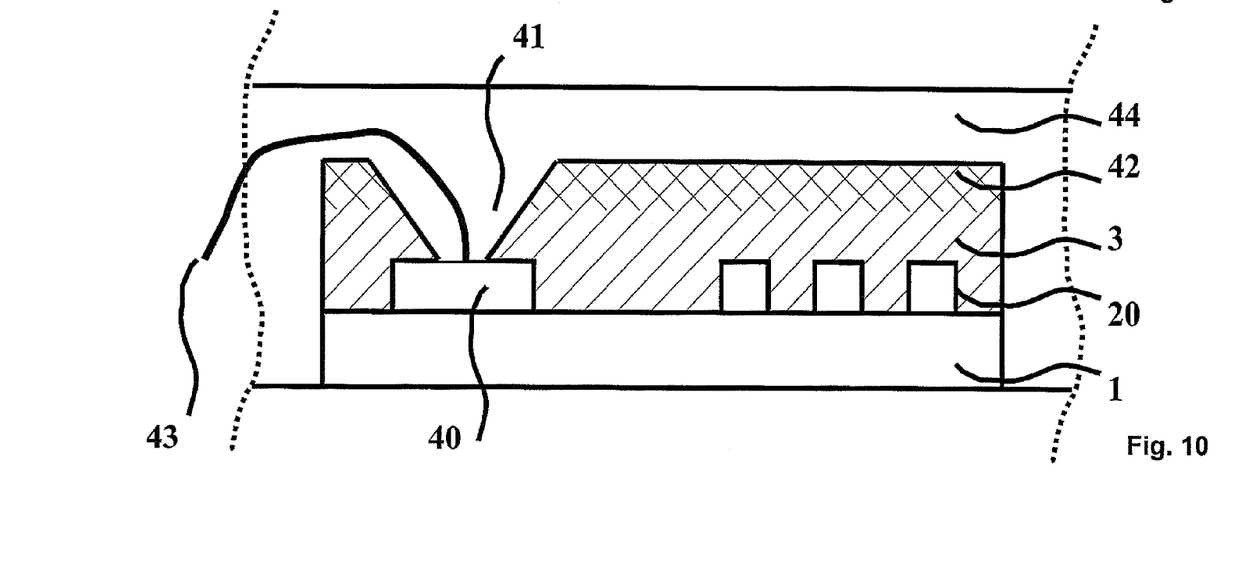
FIG. 10 is a schematic view of an electroacoustic component with packaging.

FIG. 10 shows a schematic view of an electroacoustic component with packaging. In the region of a contact terminal 40, an opening 41 is produced in the vapour-deposited layer 3 by means of a lift-off-process. The vapour-deposited layer 3 in turn is implemented in a region 42 close to the surface as a passivating layer. This leads to the construction of a type of Pre-Packaging. After wire-bonding to connect the contact terminal 40 to a wire lead 43, the electroacoustic component is then encapsulated with a moulding compound 44. The encapsulation with a moulding compound 44 can be carried out for single electroacoustic components or for a compound of multiple electronic components (not shown).

Figure 11:
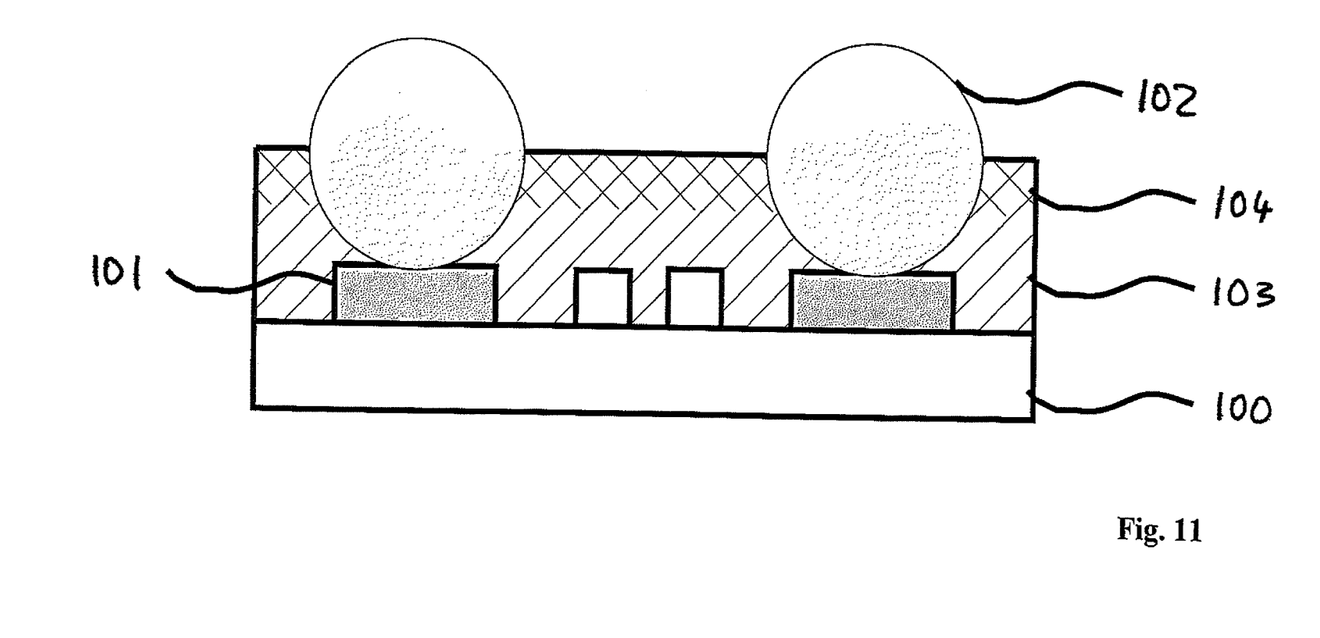
FIG. 11 is a schematic view of a pre-packaged electroacoustic component with contact pads and "solder balls".
Figure 12:
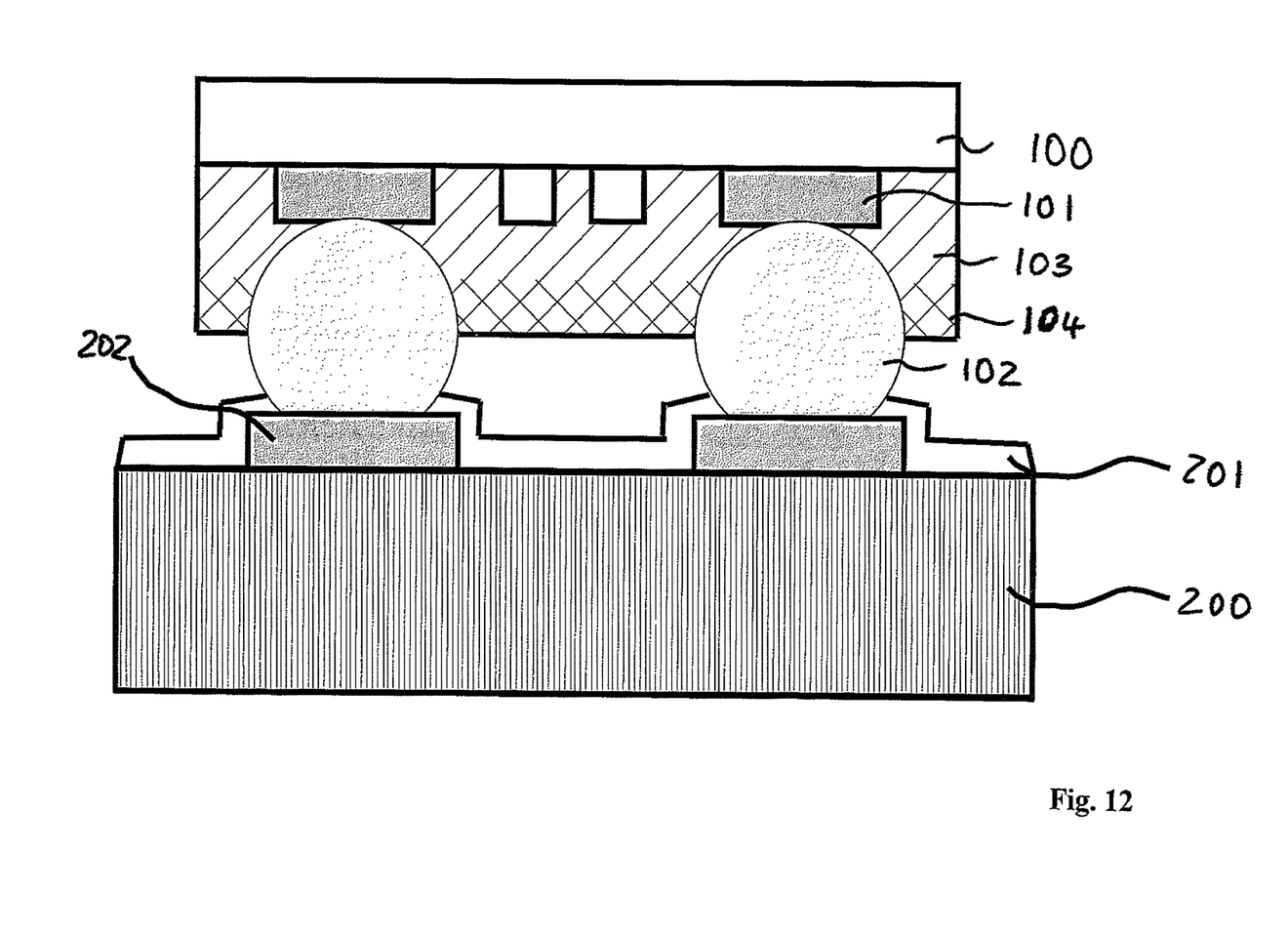
FIG. 12 is a schematic view of an arrangement with the pre-packaged electroacoustic component according to FIG. 11, which has been mounted on a circuit board.

FIG. 11 shows a schematic view of a pre-packaged electroacoustic component 100 with contact pads 101, on which solder balls 102 are formed for subsequent Flip-Chip assembly on a board (cf. FIG. 12). A dielectric layer 103 is implemented in either single-layered or multi-layered form. An upper section 104 of the dielectric layer 103 is formed with passivating properties, in order to protect the pre-packaged electroacoustic component 100 during the subsequent assembly and contacting as well as during the moulding stage.

FIG. 12 shows a schematic view of an arrangement with the pre-packaged electroacoustic component according to FIG. 11, which has been mounted on a circuit board 200. By means of the flip-chip method the pre-packaged electroacoustic component 100 is mounted on the circuit board 200, which is, for example, a circuit board made of the material FR4. The contacting can be carried out by means of a reflow step or by adhesion with electrically conductive adhesive. In order to protect the circuit board 200 during the contacting process, a solder resist 201 which is previously opened only in the region of contact surfaces 202, is applied to the circuit board 200. The electroacoustic component 100 mounted using the flip-chip method can then be moulded with a moulding compound (not shown).

The features of the invention disclosed in the present description, claims and figures may be material for realization of the invention in its various embodiments, taken in isolation or in various combinations thereof.

The invention claimed is:

1. An electroacoustic component operating with at least one of acoustic surface waves and bulk acoustic waves, the electroacoustic component comprising a substrate and an associated electrode structure and a thermally vapour-deposited dielectric layer, which is selected at least in part from at least one layer vaporising material from the following group of layer vaporising materials: vapour deposition glass material, silicon dioxide, silicon nitride and aluminium oxide, wherein the dielectric layer is formed with a non-uniform degree of material compaction within the dielectric layer.

2. The component according to claim 1, wherein on a side of the dielectric layer that is closest to an electrode structure, a proximal degree of material compression is formed, which is higher than a distal degree of material compression on a side of the dielectric layer that is furthest from the electrode structure.

3. The component according to claim 1, wherein the dielectric layer is formed with a wave propagation velocity for acoustic waves on the side closest to the electrode structure which is different to a distal propagation velocity for acoustic waves on the side of the dielectric layer that is furthest from the electrode structure.

4. The component according to claim 1, wherein silicon dioxide is deposited in the dielectric layer on the side closest to the electrode structure in a substantially stoichiometric manner.

5. The component according to claim 1, wherein the dielectric layer on the side closest to the electrode structure is formed with a base layer, and on the side furthest from the electrode structure with a passivating covering layer.

6. The component according to claim 1, wherein the dielectric layer is formed with a layer thickness between approximately 0.5 m and approximately 50 m.

7. The component according to claim 1, wherein the dielectric layer is deposited with layer regions that differ from one another with respect to at least one of their physical and chemical properties.

8. The component according to claim 1, wherein at least one bond wire and a moulded packaging are formed.

9. The component according to claim 6, wherein the dielectric layer is formed with the layer thickness between approximately 3 μm and approximately 10 μm.

* * * * *